United States Patent
Uraki et al.

(10) Patent No.: US 8,343,376 B2
(45) Date of Patent: Jan. 1, 2013

(54) PIEZOELECTRIC CERAMIC COMPOSITION

(75) Inventors: Shingo Uraki, Tokyo (JP); Ryo Suzuki, Tochigi (JP)

(73) Assignee: Konica Minolta Holdings, Inc., Tokyo (JP)

( * ) Notice: Subject to any disclaimer, the term of this patent is extended or adjusted under 35 U.S.C. 154(b) by 157 days.

(21) Appl. No.: 12/745,777

(22) PCT Filed: Nov. 6, 2008

(86) PCT No.: PCT/JP2008/070185
§ 371 (c)(1),
(2), (4) Date: Jun. 2, 2010

(87) PCT Pub. No.: WO2009/072369
PCT Pub. Date: Jun. 11, 2009

(65) Prior Publication Data
US 2010/0264354 A1    Oct. 21, 2010

(30) Foreign Application Priority Data

Dec. 6, 2007 (JP) ................................. 2007-315730

(51) Int. Cl.
C04B 35/495 (2006.01)
C04B 35/00 (2006.01)
H01L 41/18 (2006.01)
H01L 41/187 (2006.01)

(52) U.S. Cl. ............................ 252/62.9 PZ; 252/62.9 R
(58) Field of Classification Search ............... 252/62.9 R
See application file for complete search history.

(56) References Cited

U.S. PATENT DOCUMENTS 8,092,706 B2 *  1/2012  Uraki et al. ............ 252/62.9 PZ

FOREIGN PATENT DOCUMENTS

| JP | 2001-240471 | | 9/2001 |
|---|---|---|---|
| JP | 2004-345886 | | 12/2004 |
| JP | 2005-008516 | | 1/2005 |
| JP | 2006-205572 | | 8/2006 |
| JP | 200755867 | * | 3/2007 |
| JP | 2007-145650 | | 6/2007 |
| JP | 2007145650 | * | 6/2007 |

OTHER PUBLICATIONS

Chu. properties of (na,K)NbO3 and (Li,Na,K)NbO3 ceramic mixed systems. Ferroelectrics. 287 23-33 2003.*

* cited by examiner

*Primary Examiner* — Carol M Koslow
*Assistant Examiner* — Matthew E Hoban
(74) *Attorney, Agent, or Firm* — Lucas & Mercanti, LLP

(57) ABSTRACT

A $KNbO_3$—$NaNbO_3$ piezoelectric porcelain composition which exhibits a larger piezoelectric constant than those of conventional ones and does not have any secondary phase transition point in the neighborhood of room temperature (10 to 40° C.), that is, a piezoelectric porcelain composition represented by the general formula: $(1-y-z-w)(K_xNa_{1-x})NbO_3 + yLiNbO_3 + zSrTiO_3 + wBiFeO_3$, wherein $(K_xNa_{1-x})NbO_3$ represents potassium sodium niobate; $LiNbO_3$ represents lithium niobate; $SrTiO_3$ represents strontium titanate; and $BiFeO_3$ represents bismuth ferrate; with the proviso that $0.4<x<0.6$, $0<y\leq0.1$, $0<z<0.1$, $0<w<0.09$, and $0.03<y+z+w\leq0.12$.

1 Claim, 2 Drawing Sheets

PIEZOELECTRIC CERAMIC COMPOSITION

CROSS REFERENCE TO RELATED APPLICATION

This is a U.S. National Phase Application under 35 U.S.C. 371 of International Application PCT/JP2008/070185, filed Nov. 6, 2008, which claims the priority of Japanese Application No. 2007-315730, filed Dec. 6, 2007, the entire content of both Applications are hereby incorporated by reference.

TECHNICAL FIELD

The present invention relates to a piezoelectric ceramic composition.

BACKGROUND

In the past, it has been used a PZT ($PbTiO_3$—$PbZrO_3$) component-based ceramic containing lead as a piezoelectric ceramic composition. The reason for it is that the aforesaid PZT exhibits excellent piezoelectric properties and a high mechanical quality factor, and it is easy to produce materials exhibiting various desired characteristics which are required for various applications such as a sensor, an actuator, and a filter. Further, since the PZT has a high relative dielectric constant, it may also be used as a capacitor.

However, while the piezoelectric ceramic composition composed of the aforesaid PZT exhibits excellent characteristics, it contains lead as an element constituting the composition, leading to a concern that harmful lead may be eluted from industrial waste of products containing PZT to result in an environmental pollution. The increasing awareness of environmental concern in recent years has made it difficult to manufacture the products containing substances such as PZT which may be a cause of environmental pollution.

In order to resolve the above-described problem caused by the inclusion of lead as a component, there has been required a new piezoelectric ceramic composition containing no lead. In this situation, a piezoelectric ceramic composition having $KNbO_3$—$NaNbO_3$ as a main composition has been paid attention since it contains no lead and exhibits excellent piezoelectric properties.

However, although the above-described piezoelectric ceramic composition having $KNbO_3$—$NaNbO_3$ as a main composition exhibits a high Curie temperature (the first order phase transition) such as about 200° C. or higher, there exists the second order phase transition which is formed by a phase change from a ferroelectric phase at a lower temperature to a ferroelectric phase at a higher temperature in the temperature range of near room temperature. As a result, there is a possibility that degradation of properties may occur to produce a problem for practical use when the temperature cycle passes through the second order phase transition. Therefore, many technologies were proposed to decrease the temperature of the second order phase transition to be below the room temperature.

In Patent document 1, there was disclosed a piezoelectric ceramic composition containing potassium sodium lithium niobate, strontium titanate and bismuth iron oxide and represented by the formula of (1-a-b) $(K_xNa_yLi_{1-x-y})NbO_3$+$aSrTiO_3$+$bBiFeO_3$, $0<a\leq0.1$, $0<b\leq0.1$, $0<x\leq0.18$, $0.8<y<1$, provided that potassium sodium lithium niobate is $(K_xNa_yLi_{1-x-y})NbO_3$, strontium titanate is $SrTiO_3$, and bismuth iron oxide is $BiFeO_3$.

According to Patent document 1, the piezoelectric ceramic composition composed of potassium sodium lithium niobate as a main component can be controlled as follows. The composition of which is made rich in Na and strontium titanate is incorporated in an appropriate amount in the compound, and further an appropriate amount of rhombohedral crystal $BiFeO_3$ is include in the compound to become Curie temperature of about 870° C. As a result of multiple solid solute of different crystals to $(NaKLi)NbO_3$, the phase transition temperature can be changed, thereby it can be decreased the temperature change of elastic constant and the discontinuously changing portion of piezoelectric $d_{33}$ constant at around room temperature.

In Patent document 2, it was disclosed a piezoelectric ceramic composition made of a perovskite compound which is composed of Na, K, Li, Sr, Nb, and Ti as a main component, in which the formula in molar ratio is represented as: $(1-x-y)KNbO_3+xNaNbO_3+y(LiNbO_3+SrTiO_3)$, provided that x and y satisfy $0.42\leq x\leq0.50$, $0.06\leq y\leq0.12$.

According to Patent document 2, it is possible to decrease the second order phase transition temperature of the aforesaid piezoelectric ceramic composition to be below the room temperature. This can be achieved with the 4 component composition which was made by substituting a part of the composition of the 2 component piezoelectric ceramic composition mainly composed of $KNbO_3$—$NaNbO_3$ with $LiNbO_3$ and $SrTiO_3$ at the same time.

Patent document 1: JP-A No. 2007-145650
Patent document 2: JP-A No. 2007-55867

DISCLOSURE OF THE INVENTION

Problem to be Solved by the Invention

However, the piezoelectric ceramic composition mainly composed of $KNbO_3$—$NaNbO_3$ which had been reported in the past was not practically used widely compared with lead titanate zirconate and lead titanate. This is because it has only a small amount of piezoelectric constant as a piezoelectric $d_{33}$ constant. In Patent document 1, it was reported to be about 74 (pC/N) or less, and in Patent document 2, it was reported to be about 112 (pC/N) or less.

The present invention has been achieved in consideration of such problem. An object of the present invention is to provide a $KNbO_3$—$NaNbO_3$ piezoelectric ceramic composition which exhibits a higher piezoelectric constant than conventionally known $KNbO_3$—$NaNbO_3$ piezoelectric ceramic composition and does not have a second order phase transition at around room temperature (from 10° C. to 40° C.).

Means to Solve the Problem

The above-mentioned object of the present invention can be attained by the following compositions.

1. A piezoelectric ceramic composition characterized by being represented by the following formula:

$$(1-y-z-w)(K_xNa_{1-x})NbO_3+yLiNbO_3+zSrTiO_3+wBiFeO_3,$$ 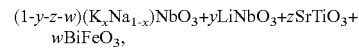

provided that $0.4<x<0.6$, $0<y\leq0.1$, $0<z<0.1$, $0<w<0.09$, and $0.03<y+z+w\leq0.12$, wherein potassium sodium niobate is represented by $(K_xNa_{1-x})NbO_3$, lithium niobate is represented by $LiNbO_3$, strontium titanate is represented by $SrTiO_3$ and bismuth iron oxide is represented by $BiFeO_3$.

2. The piezoelectric ceramic composition of the above-described item 1,
wherein a piezoelectric $d_{33}$ constant is 120 (pC/N) or more.

Effects of the Invention

According to the present invention, it is possible to provide a $KNbO_3$—$NaNbO_3$ piezoelectric ceramic composition which exhibits a higher piezoelectric constant than conventionally known $KNbO_3$—$NaNbO_3$ piezoelectric ceramic composition and does not have a second order phase transition at around room temperature (from 10° C. to 40° C.).

PREFERRED EMBODIMENTS TO CARRY OUT THE PRESENT INVENTION

Figure 1:
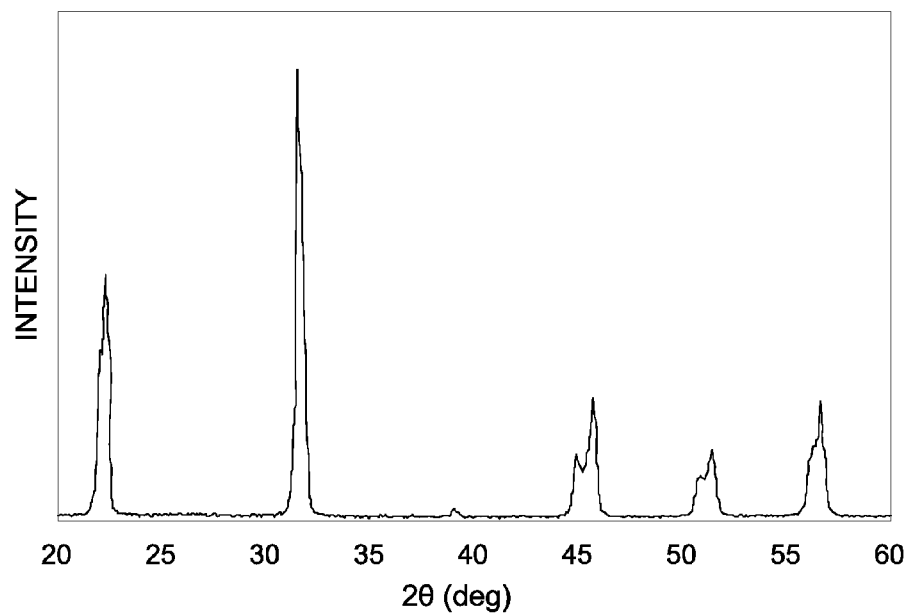
FIG. 1 is an X ray diffraction diagram of Sample No. 8 of the present invention.

An embodiment of the piezoelectric ceramic composition of the present invention will now be described.

The piezoelectric ceramic composition of the present embodiment is characterized in that it is represented by the formula of:

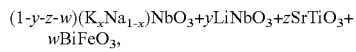

$(1-y-z-w)(K_xNa_{1-x})NbO_3+yLiNbO_3+zSrTiO_3+wBiFeO_3,$ wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide, provided that $0.4<x<0.6$, $0<y\leq0.1$, $0<z<0.1$, $0<w<0.09$, and $0.03<y+z+w\leq0.12$.

The reasons for defining the above-described range for x, y, z, w, and y+z+w each are as follows.

With respect to x, the reason of limiting as $0.4<x<0.6$ is that: the piezoelectric constant will be remarkably decreased when x is 0.4 or less; and that the sintering property will be extremely deteriorated when x is 0.6 or more.

With respect toy, the reason of limiting as $0<y\leq0.1$ is that: the sintering property will be extremely deteriorated when y is 0, since Li is not contained; and that the piezoelectric constant will be remarkably decreased when y is larger than 0.1.

With respect to z, the reason of limiting as $0<z<0.1$ is that: it cannot be obtained the piezoelectric ceramic composition having no second order phase transition at around room temperature when z is 0, since $SrTiO_3$ is not contained; and that the piezoelectric constant will be remarkably decreased when z is 0.1 or more.

With respect to w, the reason of limiting as $0<w<0.09$ is that: the piezoelectric constant will be remarkably decreased when w is 0, since $BiFeO_3$ is not contained; and that the sintering property will be extremely deteriorated when w is 0.09 or more.

With respect to "y+z+w", the reason of limiting as $0.03<y+z+w\leq0.12$ is that: the sintering property will be extremely deteriorated when "y+z+w" is 0.03 or less; and that the piezoelectric constant will be remarkably decreased when "y+z+w" is larger than 0.12.

Next, a method for producing the piezoelectric ceramic composition of the present embodiment will be described. The method for producing the piezoelectric ceramic composition is not particularly limited, but the production method via a solid phase reaction will be described.

The above-described piezoelectric ceramic composition can be provided by preparing raw materials containing each metal element as the raw materials, and then the materials being sufficiently blended by, for example, a ball mill. As raw materials the followings can be cited: $Li_2CO_3$, $Li_2O$, $LiNO_3$ and LiOH as a Li containing compound; $Na_2CO_3$, $NaHCO_3$ and $NaNO_3$ as a Na containing compound; $K_2CO_3$ and $KNO_3$ as a K containing compound; $Nb_2O_5$, $Nb_2O_3$ and $NbO_2$ as a Nb containing compound; $SrCO_3$ as a Sr containing compound; $TiO_2$ as a Ti containing compound; $Fe_2O_3$ as a Fe containing compound; and $Bi_2O_3$ as a Bi containing compound.

First, the raw materials are prepared and fully dried. The dried raw materials each were measured based on the stoichiometric ratio which satisfies the above-described formula, and they are blended via a ball-mill, then dried. Subsequently, the resulting mixture is calcined at 700 to 900° C. to decompose and solidify the raw materials via a solid phase reaction. The resulting calcined mixture is wet-pulverized into fine particles having a center of the particle size distribution of about 5 μm, and it is dried to produce a calcined powder.

To the obtained calcined powder is added an organic bonding agent such as a binder, which is then granulated and subjected to a pressure molding. The aforesaid pressure molding is preferably carried out in such a manner that the granulated substance made of the above pulverized substance is molded into the form of pellets via uniaxial pressing, and then the resulting pellets are re-molded via, for example, a cold isostatic press (CIP).

The molded material thus obtained is sintered at from 1,000 to 1,200° C. to produce a sintered product of the above-described piezoelectric ceramic composition. The resulted sintered product is cut to a predetermined size, which is then subjected to a parallel grinding and then is formed electrodes via sputtering on both sides thereof. Subsequently, in silicone oil at about from 80 to 150° C., direct current voltage of from 2 to 7 kV/mm is applied between the electrodes to produce a piezoelectric ceramic composition polarized in the thickness direction.

As describe above, the piezoelectric ceramic composition of the present invention can be achieved based on potassium sodium niobate having a specific composition which is excellent in sintering property and exhibiting high piezoelectric constant. Sintering property can be further improved by partially substituting the composition of the potassium sodium niobate with lithium niobate. Suppressing of the second order phase transition at around room temperature can be achieved by substituting the composition with strontium titanate. Further increasing of the piezoelectric constant can be achieved by substituting the composition with bismuth iron oxide.

The piezoelectric ceramic composition of the present invention can be used as a piezoelectric material of various piezoelectric elements, such as an actuator, a piezoelectric transformer, an ultrasonic motor, a piezo-electric buzzer, a sounding body, and a sensor.

Especially, an actuator that uses the displacement generated according to a piezoelectric effect as a mechanical driving source requires only small electric power and produces only small heat, and its response characteristic is also good. Furthermore, it has advantages of enabling to make downsizing and weight saving, as a result, an actuator is increasingly used in an extensive field. For the piezoelectric ceramic compositing used in this kind of actuator, there are required a large piezo electric constant with high temperature stability.

By using the piezoelectric ceramic composition which shows a large piezo electric constant and does not have a second order phase transition near room temperature (from 10° C. to 40° C.), as in shown in the present invention, for a piezoelectric actuator, it is possible to obtain a required amount of displacement with a low voltage driving. In addition, it is possible to obtain a stable piezoelectric actuator with a small change of the displacement characteristics of a piezoelectric actuator in the range of using temperature near room temperature.

Moreover, the piezoelectric ceramic composition of the present invention has a large remanent polarization Pr, as shown in the embodiment which will be mentioned later. The piezoelectric element using the piezoelectric ceramic composition having a large remanent polarization can be used also as a memory element. For example, it can also be used as a memory element by arranging a plurality of piezoelectric elements in order and impressing voltage individually. That is, it can be used as rewritable memory element to write in by providing a driving signal in accordance with information to record, and to read by detecting a polarization direction.

EXAMPLE

The piezoelectric ceramic compositions of the present invention were produced and their properties were measured as follows.

The manufacturing methods of the piezoelectric ceramic composition will now be detailed.

As raw materials of the piezoelectric ceramic composition, extremely pure $Li_2CO_3$, $Na_2CO_3$, $K_2CO_3$, $SrCO_3$, $Nb_2O_5$, $TiO_2$, $Fe_2O_3$ and $Bi_2O_3$ at a purity of at least 99% were prepared. These raw materials were fully dried, and then the amounts of the raw materials were measured as are shown in Table 1 so that the piezoelectric ceramic compositions having the formula of $(1-y-z-w)(K_xNa_{1-x})NbO_3+yLiNbO_3+zSrTiO_3+wBiFeO_3$ were produced.

The compounded raw materials were blended via a ball mill in anhydrous acetone for 24 hours, and then dried to produce a mixture.

Next, the aforesaid mixture was calcined at 700 to 900° C. for 3 hours, which mixture was then subjected to pulverization via a ball mill for 24 hours. The pulverized mixture was dried to produce a calcined powder of the component.

Subsequently, polyvinyl butyral as a binder was added to the calcined powder, and then the mixture was granulated and subjected to pressure molding. The pressure molding was carried out in such a manner that the granulated substance, made of the pulverized substance, was molded in the form of pellets via uniaxial pressing, and then the resultant pellets were re-molded via a cold isostatic press (CIP) at a pressure of 1 ton/cm².

The molded material thus produced were sintered at 1,000-1,200° C. in the atmosphere for 3 hours to produce a sintered product.

Figure 2:
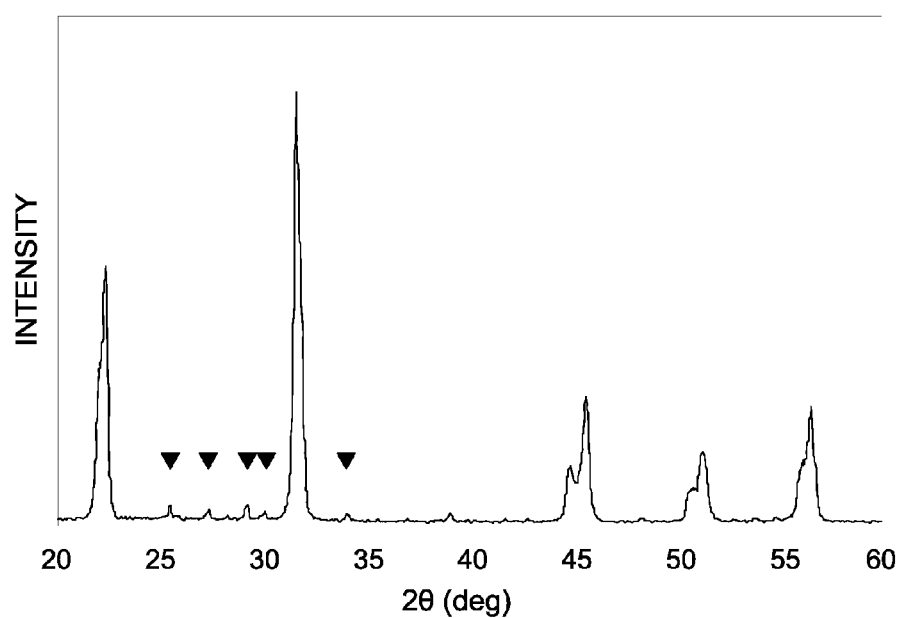
FIG. 2 is an X ray diffraction diagram of Sample No. 16 as a comparative example.

Further, the crystalline phase of the resulted sintered substance was identified via powdered X-ray diffraction (XRD) analysis. As shown in FIG. 1, the sintered substance of the present invention was confirmed to have a perovskite single-phase structure from the diffraction peak. As shown in FIG. 2, the comparative sample No. 16 was confirmed to have different phases (shown by ▼ in FIG. 2) and a perovskite single-phase structure was not obtained.

The produced samples were subjected to a bulk density measurement using an Archimedes method. A relative density was calculated from a theoretical density ratio. The sintered samples were evaluated as follows: a relative density of less than 80% was classed to be sintered with remarkable defects (C); a relative density of from 80% to less than 90% was classed to be sintered with slight defects (B); and a relative density of 90% or more was classed to be sintered without defects.

The obtained sintered product was cut to a predetermined size, which was then subjected to a parallel grinding then gold electrodes were fanned via sputtering on both sides thereof. Subsequently, in silicone oil at about from 100° C., direct current voltage of from 2 to 7 kV/mm was applied for 10 minutes between the electrodes to produce a piezoelectric ceramic composition polarized in the thickness direction.

The obtained piezoelectric ceramic composition was subjected the measurements to obtain the followings: piezoelectric $d_{33}$ constant, presence or absence of the second order phase transition near room temperature (from 10° C. to 40° C.), Curie temperature Tc, relative dielectric constant $\epsilon_r$, P-E hysteresis characteristic, remanent polarization Pr, and coercive field Ec.

The piezoelectric $d_{33}$ constant was determined via a resonance-anti-resonance method at 25° C. employing an impedance analyzer (type 4294A: manufactured by Agilent Technologies Inc.).

The presence or absence of the second order phase transition near room temperature and Curie temperature Tc were obtained by measuring a temperature dependency of the relative dielectric constant $\epsilon_r$ in the temperature range of −30° C. to +500° C. Specifically, employing an impedance analyzer (type 4294A: manufactured by Agilent Technologies Inc.) and a thermostat bath, after the sample was held for a predetermined time at every 2° C. to 5° C. interval in the range of from −30° C. to +500° C., the relative dielectric constant $\epsilon_r$ was measure with a measuring frequency of 100 kHz at each temperature. The presence or absence of the second order phase transition was determined by the presence or absence of discontinuity of the relative dielectric constant $\epsilon_r$ near room temperature based on the following criteria. The presence of the second order phase transition near room temperature was designated as "not good"; and the absence of the second order phase transition near room temperature was designated as "good". Curie temperature Tc was taken as a temperature at which the relative dielectric constant $\epsilon_r$ exhibited its highest value.

Figure 3:
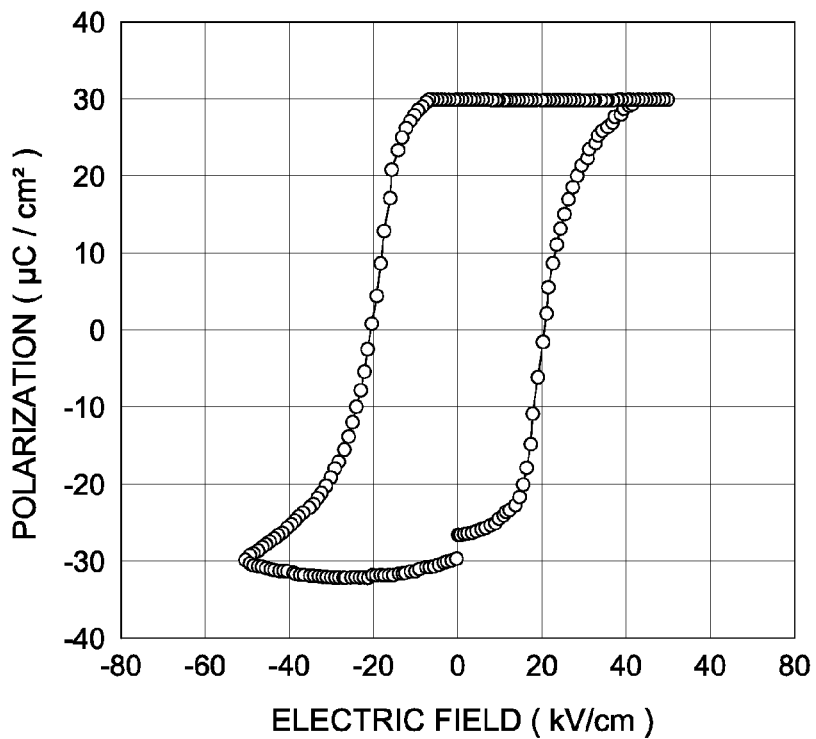
FIG. 3 is a graph showing a P-E hysteresis characteristic of Sample No. 8 of the present invention.
Figure 4:
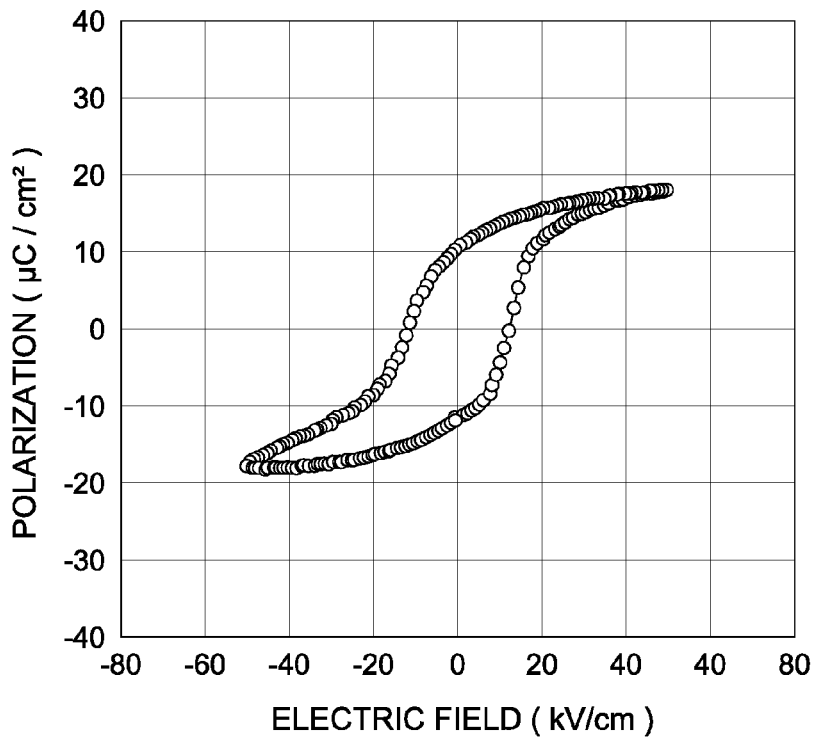
FIG. 4 is a graph showing a P-E hysteresis characteristic of Sample No. 1 as a comparative example.

The P-E hysteresis characteristics were determined by applying voltage of 5 kV at 25° C. using the Evaluation System of Characteristics of Ferroelectric Substance (a product of Radiant Technologies Inc.). The measurement result of Sample No. 8 of the present invention is shown in FIG. 3, and the measurement result of Comparative sample No. 1 is shown in FIG. 4. As is seen from FIG. 3, the piezoelectric ceramic composition of the present embodiment provides good square-shaped hysteresis loops, leading to a preferred large remanent polarization (Pr)(μC/cm²). The term "remanent polarization" refers to a magnitude of polarization when the electric field is reversed, that is, when applied electric field intensity becomes 0 kV/cm. In FIG. 3, "remanent polarization" corresponds to an amount of polarization at an intersection point of the hysteresis loop with the Y axis (the line at 0 kV/cm of the electrical field intensity).

The coercive field Ec was determined as a value of electric field when the amount of polarization is zero in the P-E hysteresis loop obtained from the measurement of P-E hysteresis characteristic.

In Table 1, there are shown data of the prepared piezoelectric ceramic compositions as: constitution; piezoelectric $d_{33}$ constant; presence or absence of the second order phase transition near room temperature; Curie temperature Tc; relative dielectric constant $\varepsilon_r$; sintering characteristic; remanent polarization Pr, and coercive field Ec. Since Sample No. 2, 11, 21 and 25 each produced sintering defect, and since Sample No. 17 exhibited the second order phase transition near room temperature, as a result, they were not able to be evaluated. In addition, since Sample No. 16, 18 and 22 each showed very small piezoelectric $d_{33}$ constant, therefore, evaluations of presence or absence of the second order phase transition near room temperature and Curie temperature Tc were suspended.

On the other hand, among the samples which did not satisfy the condition of 0.4<x<0.6, Sample No. 22 having x of less than 0.4 exhibited the piezoelectric $d_{33}$ constant of 62 (pC/N), and it was not possible to achieve the piezoelectric $d_{33}$ constant of 120 (pC/N) or more. Moreover, Sample No. 25 having x of larger than 0.6 produced sintering defect.

Among the samples which did not satisfy the condition of: 0<y≦0.1, Sample No. 2 having y of 0 produced sintering defect. And Sample No. 16 having y of larger than 0.1 produced a different phase to result in exhibiting the piezoelectric $d_{33}$ constant of 90 (pC/N), and it was not possible to achieve the piezoelectric $d_{33}$ constant of 120 (pC/N) or more.

Among the samples which did not satisfy the condition of 0<z<0.1, Sample No. 17 having z of 0 exhibited a second order phase transition near room temperature, and it was not possible to achieve the piezoelectric ceramic composition without having a second order phase transition near room temperature. And Sample No. 18 having z of larger than 0.1 exhibited the piezoelectric $d_{33}$ constant of 6 (pC/N), and it was not possible to achieve the piezoelectric $d_{33}$ constant of 120 (pC/N) or more.

Among the samples which did not satisfy the condition of: 0<w<0.09, Sample No. 1 having w of 0 exhibited the piezoelectric $d_{33}$ constant of 67 (pC/N), and it was not possible to

TABLE 1

| | Sample No. | Constitution | | | | Evaluation results | | | | | | |
|---|---|---|---|---|---|---|---|---|---|---|---|---|
| | | x | y | z | w | Pr(μC/cm²) | Ec(kV/cm) | d33(pC/N) | εr | Tc(°C.) | Second order phase transition | Sintering characteristic |
| Comparison | 1 | 0.5 | 0.04 | 0.01 | 0 | 10.2 | 12.1 | 67 | 537 | 409 | Good | Good |
| Comparison | 2 | 0.5 | 0 | 0.005 | 0.005 | — | — | — | — | — | — | Not good |
| Invention | 3 | 0.5 | 0.025 | 0.005 | 0.005 | 16.6 | 15.6 | 148 | 674 | 400 | Good | Good |
| Invention | 4 | 0.5 | 0.03 | 0.005 | 0.005 | 15.3 | 15.6 | 130 | 342 | 402 | Good | Good |
| Invention | 5 | 0.5 | 0.035 | 0.005 | 0.005 | 17.1 | 15.7 | 140 | 669 | 412 | Good | Good |
| Invention | 6 | 0.5 | 0.04 | 0.005 | 0.005 | 19.6 | 23.8 | 147 | 697 | 412 | Good | Good |
| Invention | 7 | 0.5 | 0.045 | 0.005 | 0.005 | 15.5 | 18.2 | 150 | 788 | 420 | Good | Good |
| Invention | 8 | 0.5 | 0.05 | 0.005 | 0.005 | 29.8 | 20.2 | 230 | 453 | 446 | Good | Good |
| Invention | 9 | 0.5 | 0.055 | 0.005 | 0.005 | 16.3 | 17.8 | 182 | 715 | 449 | Good | Good |
| Invention | 10 | 0.5 | 0.06 | 0.005 | 0.005 | 13.8 | 22.5 | 150 | 1043 | 453 | Good | Good |
| Comparison | 11 | 0.5 | 0.01 | 0.01 | 0.005 | — | — | — | — | — | — | Not good |
| Invention | 12 | 0.5 | 0.03 | 0.01 | 0.005 | 17.5 | 16.6 | 154 | 998 | 412 | Good | Good |
| Invention | 13 | 0.5 | 0.035 | 0.01 | 0.005 | 24.8 | 20.4 | 124 | 984 | 412 | Good | Good |
| Invention | 14 | 0.5 | 0.04 | 0.01 | 0.005 | 17.6 | 19.0 | 133 | 969 | 409 | Good | Good |
| Invention | 15 | 0.5 | 0.045 | 0.01 | 0.005 | 15.6 | 17.8 | 139 | 923 | 406 | Good | Good |
| Comparison | 16 | 0.5 | 0.11 | 0.01 | 0.005 | 2.87 | 12.4 | 90 | 731 | — | — | Good |
| Comparison | 17 | 0.5 | 0.035 | 0 | 0.005 | — | — | — | — | — | Not good | Good |
| Comparison | 18 | 0.5 | 0.02 | 0.1 | 0.005 | 1.34 | 8.1 | 6 | 953 | — | — | Good |
| Invention | 19 | 0.5 | 0.05 | 0.005 | 0.002 | 28.2 | 16.5 | 200 | 358 | 438 | Good | Good |
| Invention | 20 | 0.5 | 0.05 | 0.005 | 0.01 | 27.3 | 18.2 | 218 | 436 | 430 | Good | Good |
| Comparison | 21 | 0.5 | 0.05 | 0.005 | 0.09 | — | — | — | — | — | — | Not good |
| Comparison | 22 | 0.4 | 0.05 | 0.005 | 0.005 | 9.7 | 12.2 | 62 | 521 | — | — | Good |
| Invention | 23 | 0.45 | 0.05 | 0.005 | 0.005 | 13.3 | 16.5 | 164 | 835 | 449 | Good | Good |
| Invention | 24 | 0.55 | 0.05 | 0.005 | 0.005 | 11.3 | 16.3 | 160 | 810 | 432 | Good | Good |
| Comparison | 25 | 0.6 | 0.05 | 0.005 | 0.005 | — | — | — | — | — | — | Not good |

In Table 1, Comparative samples are outside the range of the present invention. In Table 1, the samples which satisfy all of the requirements of: 0.4<x<0.6, 0<y≦0.1, 0<z<0.1, 0<w<0.09, and 0.03<y+z+w≦0.12, exhibited excellent results. As are shown in Table 1, all of them exhibited larger piezoelectric $d_{33}$ constant than the conventionally known $KNbO_3$—$NaNbO_3$ piezoelectric ceramic composition, each sample showed larger than 120 (pC/N); they did not have the second order phase transition near room temperature; and further, it was possible to obtain the sintered material having good sintering characteristic with high density.

achieve the piezoelectric $d_{33}$ constant of 120 (pC/N) or more. Moreover, Sample No. 21 having w of larger than 0.09 produced sintering defect.

Among the samples which did not satisfy the condition of: 0.03<y+z+w≦0.12, Sample No. 2 and Sample No. 11 each having y+z+w of less than 0.03, produced sintering defect. Moreover, Sample No. 16 and Sample No. 18 each having y+z+w of larger than 0.12, exhibited the piezoelectric $d_{33}$ constant of 90 (pC/N), and it was not possible to achieve the piezoelectric $d_{33}$ constant of 120 (pC/N) or more.

In the present examples, evaluation results of the piezoelectric $d_{33}$ constant were shown as a piezoelectric constant.

However, the similar evaluations were carried out based on the piezoelectric $d_{15}$ constant and the piezoelectric $d_{31}$ constant. It was confirmed that the similar effects can be obtained.

The invention claimed is:

1. A piezoelectric ceramic composition represented by the following formula:

$$(1-y-z-w)(K_xNa_{1-x})NbO_3 + yLiNbO_3 + zSrTiO_3 + wBiFeO_3,$$

provided that $0.4 < x < 0.6$, $0 < y \leq 0.1$, $0 < z < 0.1$, $0 < w \leq 0.005$, and $0.03 < y+z+w \leq 0.12$, wherein $(K_xNa_{1-x})NbO_3$ represents potassium sodium niobate, $LiNbO_3$ represents lithium niobate, $SrTiO_3$ represents strontium titanate and $BiFeO_3$ represents bismuth iron oxide; and the piezoelectric ceramic composition has a piezoelectric $d_{33}$ constant of 120 (pC/N) or more.

* * * * *